United States Patent
van Hoof et al.

[11] Patent Number: 5,958,651
[45] Date of Patent: Sep. 28, 1999

[54] METHODS FOR PROVIDING ARTWORK ON PLASTIC INFORMATION DISCS

[75] Inventors: Peter van Hoof, Moosic; John Joseph Parette, Jessup; John F. Pierzga, Forest City, all of Pa.

[73] Assignee: WEA Manufacturing Inc., Olyphant, Pa.

[21] Appl. No.: 08/714,302

[22] Filed: Sep. 18, 1996

Related U.S. Application Data

[60] Provisional application No. 60/021,560, Jul. 11, 1996.

[51] Int. Cl.$^6$ ............................... G11B 7/26; G11B 7/24; G03F 7/00
[52] U.S. Cl. ........................ 430/292; 430/320; 430/321; 264/2.5; 264/106; 428/64.1; 428/64.4
[58] Field of Search ..................... 430/320, 321, 430/292, 323, 324, 326, 327, 328; 264/2.5, 106; 428/64.1, 64.4

[56] References Cited

U.S. PATENT DOCUMENTS

| | | |
|---|---|---|
| 3,689,078 | 9/1972 | Ban . |
| 4,118,287 | 10/1978 | Dewallens .................... 204/6 |
| 4,144,300 | 3/1979 | Breeden .................... 264/106 |
| 4,254,544 | 3/1981 | Barker ..................... 29/527.3 |
| 4,629,668 | 12/1986 | Hamersley et al. . |
| 4,967,286 | 10/1990 | Nomula et al. .......... 358/342 |
| 4,972,404 | 11/1990 | Yamaguchi et al. . |
| 5,068,846 | 11/1991 | Kramer ................. 369/275.1 |
| 5,138,604 | 8/1992 | Umeda et al. . |
| 5,398,231 | 3/1995 | Shin et al. ............ 369/275.4 |
| 5,452,282 | 9/1995 | Abraham ................. 369/603 |
| 5,470,627 | 11/1995 | Lee et al. . |
| 5,607,188 | 7/1997 | Bahns et al. ............ 283/113 |
| 5,671,205 | 9/1997 | Ledieu ................... 369/103 |

FOREIGN PATENT DOCUMENTS

| | | |
|---|---|---|
| 0 063 439 A1 | 10/1982 | European Pat. Off. . |
| 0 437 223 A2 | 7/1991 | European Pat. Off. . |
| 0 514 156 A2 | 11/1992 | European Pat. Off. . |
| 0 517 490 A2 | 12/1992 | European Pat. Off. . |
| 0 598 575 A2 | 5/1994 | European Pat. Off. . |
| 0 671 730 A1 | 9/1995 | European Pat. Off. . |
| 0 704 843 A1 | 4/1996 | European Pat. Off. . |
| 0 706 178 A2 | 4/1996 | European Pat. Off. . |
| 810593 | 3/1997 | European Pat. Off. . |
| 2710443 A1 | 3/1995 | France . |
| 56-068903 | 6/1981 | Japan . |
| 5054599 | 3/1993 | Japan . |
| 8194972 | 7/1996 | Japan . |
| 2203278 | 10/1988 | United Kingdom . |
| 93/08565 | 4/1993 | WIPO . |
| WO 94/10684 | 11/1994 | WIPO . |
| WO 95/04352 | 2/1995 | WIPO . |

OTHER PUBLICATIONS

F. Vizard, "Video's New Look", Popular Mechanics, May 1995, p. 32.

*Primary Examiner*—John A. McPherson
*Attorney, Agent, or Firm*—Fish & Neave; Robert R. Jackson; Edward M. Arons

[57] ABSTRACT

Artwork is imparted to plastic discs such as CDs, CD ROMs, and DVDs (digital video discs) by exposing a layer of photoresist material on a substrate to light from an original image of the artwork. The material of the photoresist layer is exposed to different depths by different intensity light from different image regions. Where the image is dark, the exposure is to relatively shallow, random depths. Where the image is light, the full thickness of the photoresist layer is exposed. Development of the photoresist layer removes the exposed photoresist material. The surface features of the developed photoresist layer and any uncovered substrate are transferred to a member used in forming a surface of the plastic disc, thereby visibly embossing the image in the disc.

21 Claims, 3 Drawing Sheets

METHODS FOR PROVIDING ARTWORK ON PLASTIC INFORMATION DISCS

This application claims the benefit of U.S. provisional application No. 60/021,560, filed Jul. 11, 1996.

BACKGROUND OF THE INVENTION

This invention relates to plastic information discs such as digital video discs ("DVDs"), compact discs ("CDs"), compact disc read-only memories ("CD ROMs"), and the like, and more particularly to providing visible image information ("artwork") on such discs. For convenience herein, all such discs will be referred to generically as discs, although it will sometimes also be necessary to specifically mention certain kinds of these discs.

Labels and other ornamentation are needed on discs for such purposes as identifying the information content of the disc, identifying the source (manufacturer and/or distributor) of the disc, making the disc more interesting and appealing to the eye, etc. Such artwork is frequently applied by "silk screening" one of the two major surfaces of the substantially planar disc (the other major surface being the surface through which information recorded on the disc is read by machine from the disc). Silk screening or other generally similar printing techniques can produce extremely attractive results, but these techniques add extra steps to the disc manufacturing process and therefore increase the cost of the discs. It is also known to use so-called "pit art" on discs (see, for example, U.S. patent application Ser. No. 08/579,302, filed Dec. 27, 1995, now U.S. Pat. No. 5,729,533, which is hereby incorporated by reference herein). Such pit art may be produced using technology similar to that used to record or store information on the disc, but instead of the features being generally microscopic (and apparently random to the naked eye) for information recording, more macroscopic features are employed to produce a visible image. Pit art can provide many interesting visual effects, and because it is produced during molding of the disc, it may reduce or eliminate the need for separate printing steps. However, there may be some complexity associated with translating a desired visual image into pit art form.

In view of the foregoing, it is an object of this invention to improve and simplify the provision of visible images on discs.

It is a more particular object of this invention to provide improved and simplified methods for molding visible images into discs.

SUMMARY OF THE INVENTION

These and other objects of the invention are accomplished in accordance with the principles of the invention by providing improved methods for transferring or translating a desired visible image into a form in which it can be rendered in a mold member to be used in molding discs. A layer of photoresist material, typically disposed on a substrate surface, is exposed to the desired visible image (e.g., by placing a transparency of the visible image over the photoresist layer and shining light on the photoresist layer through the visible image). The light from the image photochemically changes ("exposes") the photoresist material to different depths in different regions of the image. Where the image is relatively dark or opaque, only a relatively small amount of randomly scattered light reaches the photoresist layer and exposes that layer to random depths which are less than the full thickness of the layer. Where the image is relatively light or transparent, enough light reaches the photoresist layer to expose that layer all the way through to the substrate.

After the above-described exposure, the photoresist layer is "developed" (e.g., placed in a photoresist developer solution). This removes the exposed photoresist material. The resulting patterned surface of the remaining photoresist material and some now-uncovered substrate surface is used to produce a similar pattern in the surface of a forming member to be used in forming discs (in particular, forming one of the two, substantially planar, major surfaces of each disc). (In this context, "similar pattern" means either the same pattern or a complementary pattern analogous to the relationship between positive and negative forms in molding processes generally.) Preferably the forming member is used in the mold in which discs are molded so that the visible image is molded into the disc surface as part of the disc molding process. Where the forming member surface is randomized (corresponding to dark or opaque areas in the original image), the forming member gives the resulting disc a light, frosted appearance due to the random scattering of light impinging on those portions of the disc. Where the forming member surface is smoother (corresponding to light or transparent areas in the original image), the forming member gives the resulting disc a dark, polished or mirror-like appearance due to the more regular reflection of light impinging on those portions of the disc.

The substrate surface may be smooth (as is assumed above) or roughened (e.g., by sand blasting or chemical etching). A roughened substrate surface gives the portions of the visible image that are associated with uncovered portions of the substrate surface a brushed appearance (which may contrast with the above-mentioned frosted-appearing portions of the image).

Further features of the invention, its nature and various advantages, will be more apparent from the accompanying drawings and the following detailed description of the preferred embodiments.

DETAILED DESCRIPTION OF THE PREFERRED EMBODIMENTS

For purposes of illustration, the invention will be described for the most part in the context of its application to digital video discs ("DVDs"). It will be understood, however, that the invention is equally applicable to other types of information recording discs.

Figure 1:
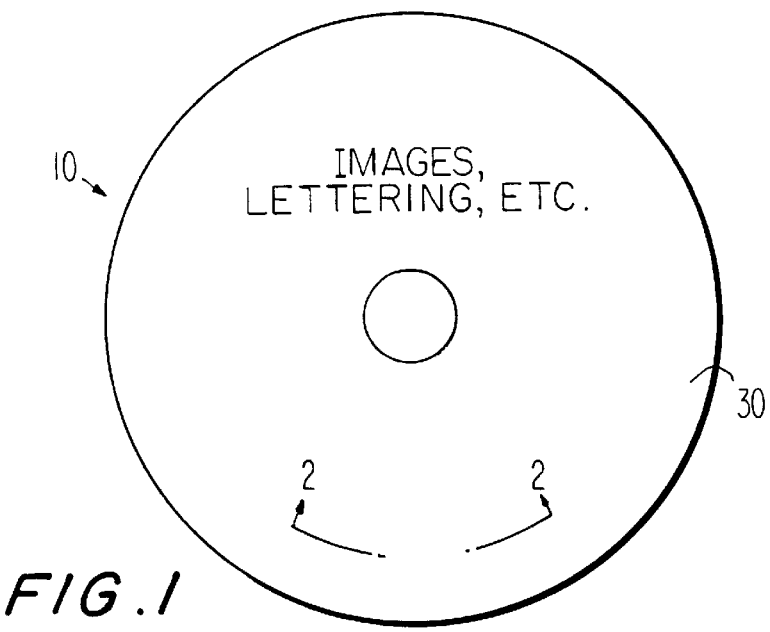
FIG. 1 is a simplified elevational view of an illustrative disc made in accordance with this invention.
Figure 2:
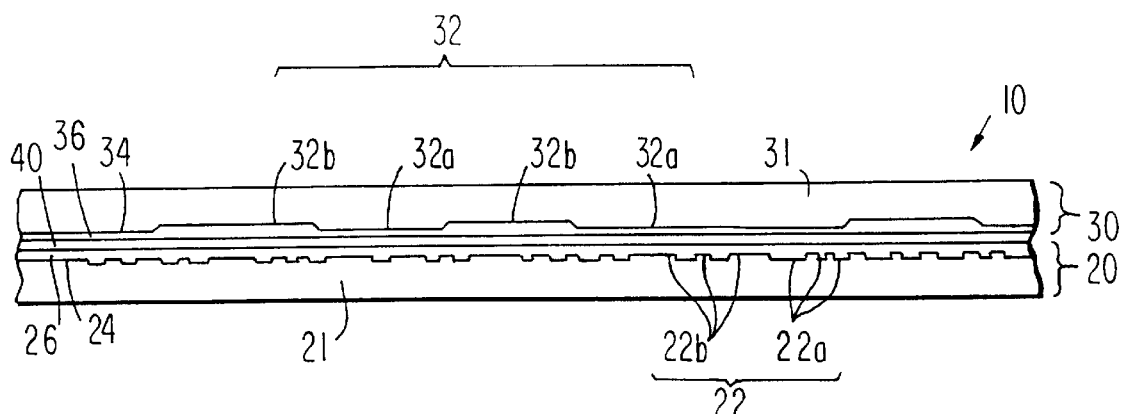
FIG. 2 is a simplified sectional view taken along the line 2—2 in FIG. 1. For greater clarity, section lines have not been employed in FIG. 2 or any of the subsequent FIGS.

As shown in FIGS. 1 and 2 a DVD 10 is typically made of two CD-type discs 20 and 30 glued back-to-back. FIGS.

1 and 2 illustrate the case in which only one of these two discs is needed for information recording. The other disc can then be used entirely for artwork in accordance with this invention. If both discs are needed for information recording, then artwork in accordance with this invention can be confined to portions of either disc that are not needed for such information recording.

In the illustrative embodiment shown in FIGS. 1 and 2, lower disc 20 is used for information recording, while upper disc 30 is used for visible image information in accordance with this invention. Discs 20 and 30 are held together by a layer of adhesive 40 between the "backs" of the discs. Information is recorded on disc 20 in the form of a very long spiral "track", along which a succession of "pits" and "lands" are formed (e.g., molded) in the plastic surface. These pits and lands are indicated by features 22a and 22b in FIG. 2. A thin layer 24 of aluminum is applied to this surface to make the pits and lands machine-readable by light reflection through the substantially clear plastic 21 which is the major component of the disc. Then a protective layer 26 of resin such as lacquer is applied over the aluminum.

Visible image disc 30 may be constructed in a generally similar way. The visible image information is formed into a surface of the plastic as represented by features such as 32a and 32b. This surface is covered with a thin layer 34 of aluminum, and the aluminum is covered with a protective layer 36 of resin. The image information is visible to a user of the disc by the way light is reflected from aluminum layer 34 through substantially clear plastic 31.

Figure 3:
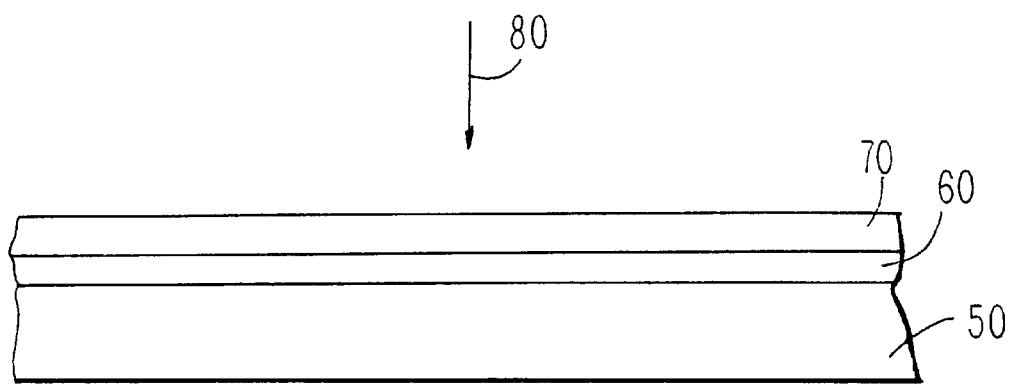
FIG. 3 is a simplified sectional view of illustrative structure used in accordance with this invention.

The start of an illustrative embodiment for capturing a visible image in disc 30 in accordance with this invention is shown in FIG. 3. Element 50 is a substrate member such as a glass plate. One surface of substrate 50 is coated with a layer 60 of photoresist material such as Shipley S1818 AZ photoresist having a 15% concentration. An illustrative thickness of layer 60 is approximately 1 micron. The substrate and photoresist layer are baked (e.g., for about 30 minutes at 80° C.) to set the photoresist material.

A transparency 70 containing a representation of the desired visible image is then placed over the photoresist layer. Transparency 70 may be a conventional positive film and a diffusion sheet. The diffusion sheet is a translucent film with a frosted appearance for helping to ensure that the frosted-appearing image portions described below are produced. Any other suitable image source may be used.

The next step is to shine light 80 on photoresist layer 60 through image-bearing member 70. For example, the source of light 80 may be a 1000 watt metal halide lamp which is operated for about 30 seconds. The light reaching layer 60 exposes the photoresist material of that layer to a depth proportional to the amount of light received in each region of the layer. Where image 70 is relatively dark or opaque, only a relatively small amount of randomly scattered light reaches photoresist layer 60 and exposes that layer to random depths which are less than the full thickness of the layer. Where the image 70 is relatively light or transparent, enough light reaches photoresist layer 60 to expose that layer all the way through to substrate 50.

The term "expose" or the like is used herein to refer to the photo-chemical change which occurs in photoresist material when it receives light. This photo-chemical change renders the exposed material soluble in photoresist developer solution.

Figure 4:
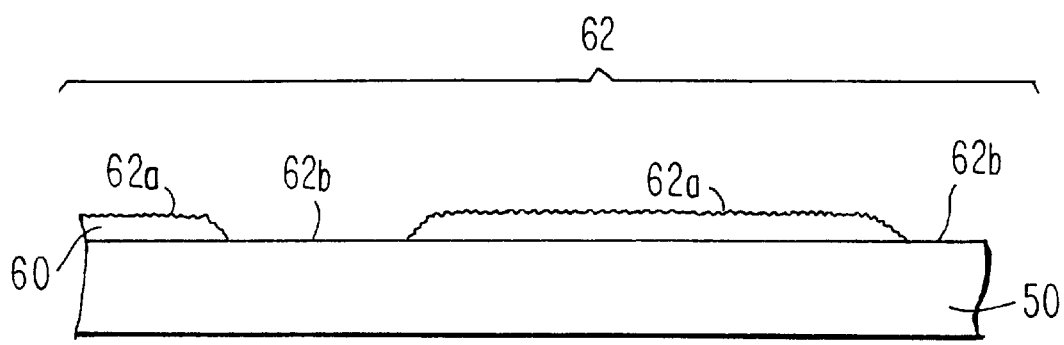
FIG. 4 shows portions of the structure of FIG. 3 at a later stage in their use in accordance with the invention.

After layer 60 has been exposed to the lighted image as described above, light 80 is extinguished, image bearing member 70 is removed, and substrate 50 and layer 60 are placed in a photoresist developer solution (e.g., a 20% concentration of Shipley microposit developer solution for 25 seconds). This removes the exposed photoresist material from layer 60. FIG. 4 is a simplified depiction of how substrate 50 and what remains of layer 60 may appear after development as described above. In regions such as 62a some of photoresist layer 60 remains, albeit with a randomly roughened surface due to the relatively small amount of randomly scattered light that reached those portions of layer 60 through associated relatively dark or opaque portions of image 70. In region 62b, on the other hand, all of the photoresist material has been removed to uncover a portion of the surface of substrate 50. Regions 62b are therefore associated with relatively light or transparent portions of image 70 through which sufficient light passed to expose photoresist layer 60 all the way through to substrate 50. For convenience in what follows, regions 62a and 62b are sometimes referred to collectively as surface 62.

Figure 5:
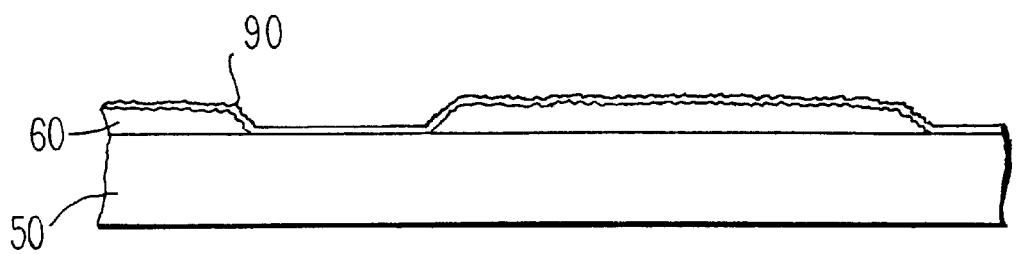
FIG. 5 shows a still later stage of use of the above-mentioned structure in accordance with the invention.
Figure 6:
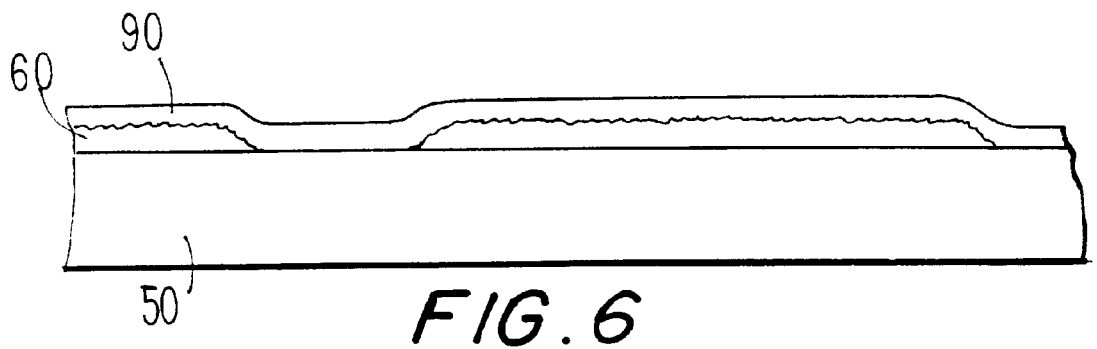
FIG. 6 shows a further development of the structure of FIG. 5 in accordance with the invention.

The next steps are performed to transfer the shape of surface 62 to a member that can be used to form disc surfaces. In a particularly preferred embodiment this is done in the same general way that is conventionally used to produce the forming member that is used to record information (pits and lands) in a disc. Elements 50 and 60, as shown in FIG. 4, are placed in an atmosphere of metal vapor such as nickel vapor. A thin layer 90 of metal deposits or condenses on surface 62 as shown in FIG. 5. The structure shown in FIG. 5 is then put in a metal plating solution to plate more metal (e.g., more nickel) on surface 62 as shown in FIG. 6. For simplicity the thicker metal layer shown in FIG. 6 continues to be identified by the reference number 90. Note that the lower surface of layer 90 conforms exactly to surface 62. Accordingly, the lower surface of layer 90 is randomly rough in regions corresponding to surface regions 62a, but smooth in regions corresponding to surface regions 62b.

Figure 7:
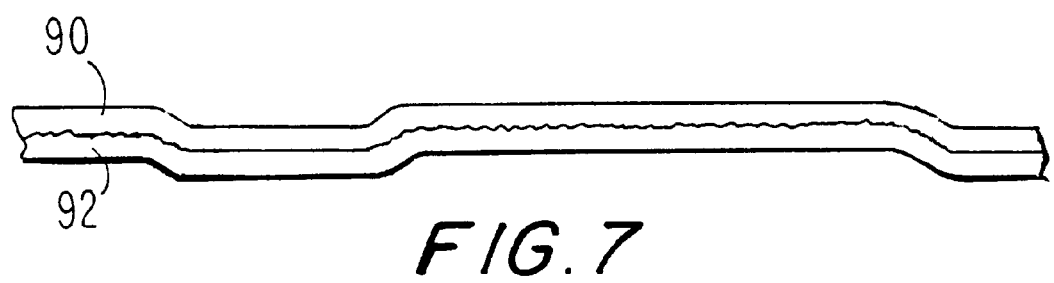
FIG. 7 shows further processing of one of the elements from FIG. 6.
Figure 8:
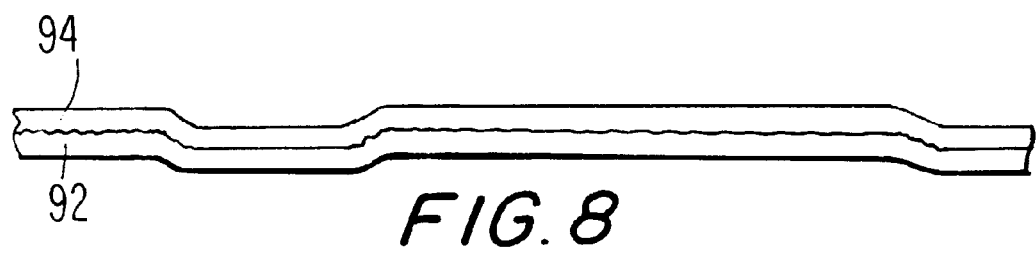
FIG. 8 shows further processing of one of the elements from FIG. 7.

Next, metal layer 90, which is now sufficiently thick and strong to retain its shape unsupported, is removed from elements 50 and 60. Metal layer 90 is used as a "master" to shape complementary metal "intermediaries" 92 as shown in FIG. 7. For example, several intermediaries 92 may be made from one master 90 by several successive repetitions of steps such as the following: (1) passivate the surface of the master, (2) plate metal on the passivated surface, and (3) separate the newly plated metal from the master to produce the intermediary. Several forming members 94 (FIG. 8) may then be produced from each intermediary 92 by repeating, with the intermediary, steps like those used to make the intermediary from master 90. Each forming member 94 (also known as a "stamper") is usable as an interior surface of a mold in which the plastic portion 31 of discs 30 (FIGS. 1 and 2) are molded. Accordingly, a forming member 94 used in this way imparts its surface shape to the surface 32 of the plastic part of the disc. To complete disc 30, a layer 34 of a light-reflective metal such as aluminum is deposited on patterned plastic surface 32, and then a protective layer 36 of resin such as lacquer is deposited over the metal layer.

The artwork embossed in surface 32 is rendered highly visible by light reflected through substantially clear plastic 31 by similarly patterned metal layer 34 on surface 32. For example, surface regions 32a may correspond to surface regions 62a in FIG. 4. In that case regions 32a are randomly rough (like regions 62a) and scatter light that falls on them. Regions 32a therefore appear light or frosted and produce light areas in the disc artwork. Regions 32b, on the other hand, may correspond to surface regions 62b in FIG. 4. Regions 32b therefore have the surface features of substrate 50 (assumed in this embodiment to be smooth). Accordingly, regions 32b have more uniform light reflectivity and thus appear mirror-like and dark, thereby producing dark areas in the disc artwork. Indeed, continuing with the assumption that substrate 50 is smooth, regions 32b tend to have a polished appearance, which contrasts strongly with the frosted appearance of regions 32a.

Another way to produce images of the type described above is to first briefly expose the entire surface of the photoresist layer to light through a diffusion sheet of the type described above. This exposes the photoresist layer all over to relatively shallow random depths (less than the full thickness of the photoresist layer). Then the photoresist layer is further exposed to light through a transparency bearing image information. In particular, the transparency includes relatively light or transparent regions through which sufficient light can pass to expose the photoresist layer all the way down to the substrate. Elsewhere the transparency does not allow significant alteration of the photoresist layer exposure produced by the diffusion sheet. The photoresist layer is then developed and further processed as described above. Portions of the resulting disc image that are associated with photoresist layer exposure due primarily to the diffusion sheet have a frosty or light appearance. Portions of the resulting disc image that are associated with photoresist layer exposure all the way down to the substrate have a polished, dark, or mirror-like appearance. Similar results are produced if the sequence of exposures of the photoresist layer is reversed (i.e., if the photoresist layer is first exposed to light through the image bearing transparency and then exposed to light through the diffusion sheet).

Many different kinds of graphic effects can be easily produced by the methods of this invention. For example, various shades of light and dark can be produced from substantially conventional half-tone original artwork 70. In such an original 70 the size of the half-tone dots determines the apparent overall lightness or darkness of each image region. These dots are effectively preserved in a forming member made in accordance with this invention as roughened regions (corresponding to regions 62a in FIG. 4) in the surface of the forming member. The dimensions of these roughened regions, as well as their spacing from adjacent similar features, affect light reflection from the resulting metal layer 34, and thereby impart different sensations of lightness or darkness similar to the tone variations in the original image.

If, instead of being smooth as is assumed above, the surface of substrate 50 on which photoresist layer 60 is deposited is textured (e.g., by sand blasting or by chemical etching such as with hydrofluoric acid if substrate 50 is glass), then portions of the disc image associated with regions 62b (FIG. 4) will have a brushed metal appearance.

To be more specific about the possible use of textured or roughened substrate surfaces as has just been mentioned, the roughening of that surface is preferably such that the maximum height of substrate surface features under photoresist layer 60 is in the range from about 300 nanometers to about 1000 nanometers. Layer 60 is preferably initially thick enough to more than fill in all the surface features on the substrate surface. For example, the average initial thickness of layer 60 may be in the range from about 300 nanometers to about 1000 nanometers. The light areas of original image 70 allow light 80 to expose layer 60 all the way down to the substrate surface. This causes the roughened substrate surface to be uncovered as at 62b in FIG. 4. This in turn causes a forming member 94 ultimately produced in accordance with the invention to have the roughened texture of the substrate surface. This roughened texture is imparted to corresponding portions of the disc image, giving those portions the above-described brushed metal appearance.

It will be understood that the foregoing is only illustrative of the principles of this invention, and that various modifications can be made by those skilled in the art without departing from the scope and spirit of the invention. For example, instead of random roughening of the surface of substrate 50, that surface could be roughened with a particular pattern such as a series of parallel lines, a grid, or a moire pattern. As another example of modifications within the scope of the invention, it may be possible to project the original image onto photoresist layer 60. Rather than being used as a mold member, forming member 94 may be used to stamp the embossed image into the plastic of the disc. The various dimensions and materials mentioned herein are preferred, but other dimensions and materials can be used if desired.

The invention claimed is:

1. A method of forming an image visible as the ordinary reflection of light from an at least partially randomly roughened portion of a major surface of a substantially planar plastic disc comprising the steps of:

providing a substantially smooth layer of photoresist material on a substrate;

providing a representation of said visible image on a medium in which said visible image is represented by different degrees of opacity of different portions of said medium;

shining light through said medium onto said substantially smooth layer in order to expose said layer to different depths in different regions indicative of the opacity of the portion of the medium associated with each region;

removing exposed photoresist material from said layer to leave at least Part of said layer with a randomly roughened surface;

forming an impression of what remains of said layer and any uncovered substrate in a forming member; and using said forming member to make an impression in said major surface of said disc.

2. The method defined in claim 1 wherein said layer is initially approximately 1 micron thick.

3. The method defined in claim 1 wherein in said shining step said layer is exposed all the way through to said substrate surface in some but not all of said regions of said layer, so that in said forming step the impression formed includes an impression of said substrate surface where said layer was exposed all the way through to said substrate surface.

4. The method defined in claim 3 wherein said substrate surface is substantially smooth.

5. The method defined in claim 1 wherein said medium is a transparency, and wherein prior to said shining step said transparency is placed on said layer.

6. The method defined in claim 1 wherein said representation of said visible image includes half-tone image information.

7. The method defined in claim 1 wherein said removing step comprises the step of:

placing said layer in photoresist developer solution.

8. The method defined in claim 1 wherein said forming step comprises the steps of:

coating what remains of said layer and any uncovered substrate with metal; and separating said metal from said layer and substrate.

9. The method defined in claim 8 wherein said coating step comprises the steps of:

exposing said layer and uncovered substrate to a vapor of said metal so that metal condenses on said layer and uncovered substrate; and plating additional metal on the metal that has condensed on said layer and uncovered substrate.

10. The method defined in claim 8 wherein said forming step further comprises the step of:

using the metal separated from said layer and substrate as a master for making said forming member.

11. The method defined in claim 10 wherein said step of using the metal comprises the steps of:

removably depositing additional metal on said master;

separating said additional metal from said master to produce an intermediary;

removably depositing further metal on said intermediary; and separating said further metal from said intermediary to produce said forming member.

12. The method defined in claim 1 wherein said using step comprises the step of:

employing said forming member as a surface of a mold in which said disc is molded.

13. A plastic disc made by the method of claim 1.

14. A method of forming a visible image on a major surface of a substantially planar plastic disc comprising the steps of:

providing a layer of photoresist material on a substrate;

providing a representation of said visible image on a medium in which said visible image is represented by different degrees of opacity of different portions of said medium;

shining light through said medium onto said layer in order to expose said layer to different depths in different regions indicative of the opacity of the portion of the medium associated with each region;

removing exposed photoresist material from said layer;

forming an impression of what remains of said layer and any uncovered substrate in a forming member;

using said forming member to make an impression in said major surface of said disc; and further comprising the step of exposing the photoresist layer to light through a diffusion sheet prior to performing said shining step.

15. A method of forming a visible image on a major surface of a substantially planar plastic disc comprising the steps of:

providing a layer of photoresist material on a substrate;

providing a representation of said visible image on a medium in which said visible image is represented by different degrees of opacity of different portions of said medium;

shining light through said medium onto said layer in order to expose said layer to different depths in different regions indicative of the opacity of the portion of the medium associated with each region;

removing exposed photoresist material from said layer;

forming an impression of what remains of said layer and any uncovered substrate in a forming member;

using said forming member to make an impression in said major surface of said disc; and further comprising the step of exposing the photoresist layer to light through a diffusion sheet after performing said shining step.

16. A method of forming a visible image on a major surface of a substantially planar plastic disc comprising the steps of:

providing a layer of photoresist material on a substrate;

providing a representation of said visible image on a medium in which said visible image is represented by different decrees of opacity of different portions of said medium;

shining light through said medium onto said layer in order to expose said layer to different depths in different regions indicative of the opacity of the portion of the medium associated with each region;

removing exposed photoresist material from said layer;

forming an impression of what remains of said layer and any uncovered substrate in a forming member;

using said forming member to make an impression in said major surface of said disc;

wherein in said shining step said layer is exposed all the way through to said substrate surface in some but not all of said regions of said layer, so that in said forming step the impression formed includes an impression of said substrate surface where said layer was exposed all the way through to said substrate surface; and wherein said substrate surface is roughened.

17. The method defined in claim 16 wherein the maximum depth of roughening of said substrate surface is in the range from about 300 nanometers to about 1000 nanometers.

18. The method defined in claim 17 wherein said step of providing a layer of photoresist material on a substrate comprises the step of:

covering said substrate surface with a thickness of photoresist material substantially greater than the maximum depth of said roughening.

19. The method defined in claim 17 wherein said thickness of photoresist material is in the range from about 300 nanometers to about 1000 nanometers.

20. The method defined in claim 16 wherein said substrate surface is roughened by sand blasting that surface.

21. The method defined in claim 16 wherein said substrate surface is roughened by chemically etching that surface.

* * * * *